United States Patent
Weilemann, II et al.

(10) Patent No.: US 9,329,921 B2
(45) Date of Patent: May 3, 2016

(54) IMMINENT READ FAILURE DETECTION USING HIGH/LOW READ VOLTAGE LEVELS

(71) Applicants: Jon W. Weilemann, II, Austin, TX (US); Richard K. Eguchi, Austin, TX (US)

(72) Inventors: Jon W. Weilemann, II, Austin, TX (US); Richard K. Eguchi, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 82 days.

(21) Appl. No.: 14/262,074

(22) Filed: Apr. 25, 2014

(65) Prior Publication Data

US 2015/0309856 A1    Oct. 29, 2015

(51) Int. Cl.
  *G11C 29/00* (2006.01)
  *G06F 11/07* (2006.01)
  *G06F 11/10* (2006.01)

(52) U.S. Cl.
  CPC .......... *G06F 11/0772* (2013.01); *G06F 11/073* (2013.01); *G06F 11/1008* (2013.01)

(58) Field of Classification Search
  CPC G06F 11/0772; G06F 11/078; G06F 11/1008
  See application file for complete search history.

(56) References Cited

U.S. PATENT DOCUMENTS

| | | | |
|---|---|---|---|
| 6,226,200 B1 | 5/2001 | Eguchi et al. | |
| 6,684,353 B1 | 1/2004 | Parker et al. | |
| 7,865,797 B2 | 1/2011 | Eguchi et al. | |
| 7,944,744 B2 | 5/2011 | Bryant-Rich | |
| 8,095,836 B2 | 1/2012 | Eguchi et al. | |
| 8,321,727 B2 | 11/2012 | D'Abreu et al. | |
| 8,504,884 B2 * | 8/2013 | Eguchi | G11C 29/42 714/721 |
| 2009/0204852 A1 | 8/2009 | Diggs et al. | |
| 2011/0107160 A1 * | 5/2011 | Eguchi | G06F 11/004 714/704 |
| 2012/0254699 A1 | 10/2012 | Ruby et al. | |
| 2014/0059398 A1 | 2/2014 | Cunningham et al. | |

OTHER PUBLICATIONS

Weilemann et al., "Imminent Read Failure Detection Based Upon Unacceptable Wear for NVM Cells", U.S. Appl. No. 14/262,116, filed Apr. 25, 2014; 23 pgs.
Weilemann et al., "Imminent Read Failure Detection Based Upon Changes in Error Voltage Windows for NVM Cells", U.S. Appl. No. 14/262,157, filed Apr. 25, 2014; 25 pgs.

(Continued)

*Primary Examiner* — Sam Rizk
(74) *Attorney, Agent, or Firm* — Egan, Peterman, Enders & Huston LLP.

(57) ABSTRACT

Methods and systems are disclosed for imminent read failure detection using high/low read voltage levels. In certain embodiments, data stored within an array of non-volatile memory (NVM) cells is checked using read voltage levels below and above a normal read voltage level. An imminent read failure is then indicated if errors are detected within the same address for both voltage checks. Further, data stored can be checked using read voltage levels that are incrementally decreased below and incrementally increased above a normal read voltage level. An imminent read failure is then indicated if read errors are detected within the same address for both voltage sweeps and if high/low read voltage levels triggering faults differ by less than a predetermined threshold value. An address sequencer, error correction code (ECC) logic, and a bias generator can be used to implement the imminent failure detection.

20 Claims, 6 Drawing Sheets

(56) References Cited

OTHER PUBLICATIONS

Office action mailed Sep. 21, 2015, for Weilemann et al., "Imminent Read Failure Detection Based Upon Unacceptable Wear for NVM Cells", U.S. Appl. No. 14/262,116, filed Apr. 25, 2014; 11 pgs.

Office Action mailed Sep. 24, 2015, for Weilemann et al., "Imminent Read Failure Detection Based Upon Changes in Error Voltage Windows for NVM Cells", U.S. Appl. No. 14/262,157, filed Apr. 25, 2014; 12 pgs.

Response to Office action filed Dec. 21, 2015, for Weilemann et al., "Imminent Read Failure Detection Based Upon Unacceptable Wear for NVM Cells", U.S. Appl. No. 14/262,116, filed Apr. 25, 2014; 6 pgs.

Response to Office Action filed Dec. 21, 2015, for Weilemann et al., "Imminent Read Failure Detection Based Upon Changes in Error Voltage Windows for NVM Cells", U.S. Appl. No. 14/262,157, filed Apr. 25, 2014; 8 pgs.

* cited by examiner

US 9,329,921 B2

IMMINENT READ FAILURE DETECTION USING HIGH/LOW READ VOLTAGE LEVELS

RELATED APPLICATIONS

This application is related in subject matter to the following concurrently filed applications: U.S. patent application Ser. No. 14/262,116, entitled "IMMINENT READ FAILURE DETECTION BASED UPON UNACCEPTABLE WEAR FOR NVM CELLS," and U.S. patent application Ser. No. 14/262,157, entitled "IMMINENT READ FAILURE DETECTION BASED UPON CHANGES IN ERROR VOLTAGE WINDOWS FOR NVM CELLS," and which are each hereby incorporated by reference in its entirety.

TECHNICAL FIELD

This technical field relates to non-volatile memories (NVMs) and, more particularly, to techniques for detecting imminent read failures for data stored by NVM cells.

BACKGROUND

Programmable memories have been implemented using non-volatile memory (NVM) cells with each cell storing a bit of data. These programmable memories can be implemented as stand-alone memory integrated circuits or can be embedded within other integrated circuits.

During operation, data stored within NVM cells can include errors. As such, many NVM systems use error correction code (ECC) routines to improve performance. For example, for multi-bit data located at a given address within the NVM system, an ECC routine is applied to the multi-bit data to generate ECC data that is stored within the NVM system and associated with the multi-bit data. When this multi-bit data is subsequently read from the address location, the ECC routine is performed again to re-generate the ECC data for the multi-bit data. The re-generated ECC data is then compared to the original ECC data to determine if there are bit errors associated with the data stored at that address. For example, ECC routines can be employed that can identify and correct single-bit errors and that can identify but not correct double-bit errors. Further, for such ECC routines, errors including three or more bits can be inaccurately detected as single-bit or double-bit errors or no errors.

For some applications where read failures can cause catastrophic results, it is desirable to detect uncorrectable read failures that have not yet occurred but are likely to occur in the near future. Identifying NVM cells associated such imminent read failures allow these read failures to be avoided thereby avoiding potential catastrophic results for sensitive applications.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale

DETAILED DESCRIPTION

Methods and systems are disclosed for imminent read failure detection using high and low read voltage levels. In certain embodiments, data stored within an array of non-volatile memory (NVM) cells is checked using a selected read voltage level below a normal read voltage level and again using a selected read voltage level above the normal read voltage level. An imminent read failure is then indicated if read errors are detected within the same error correction address for both the low and high read voltage level array checks. Further, data stored within an array of NVM cells can be checked using a read voltage levels that are incrementally decreased below a normal read voltage level and again using read voltage levels that are incrementally increased above the normal read voltage level. An imminent read failure is then indicated if read errors are detected within the same error correction address for both the low and high read voltage sweeps and if high level and low level read errors are triggered at read voltage levels that are different by less than a predetermined voltage window threshold value. For the array data checks, an address sequencer can be used to cycle through addresses within the array of NVM cells; error correction code (ECC) logic can be used to detect read errors; and a bias generator can be used to adjust the read voltage levels for the array of NVM cells. Different features and variations can also be implemented and related or modified systems and method can be utilized, as well.

Figure 1:
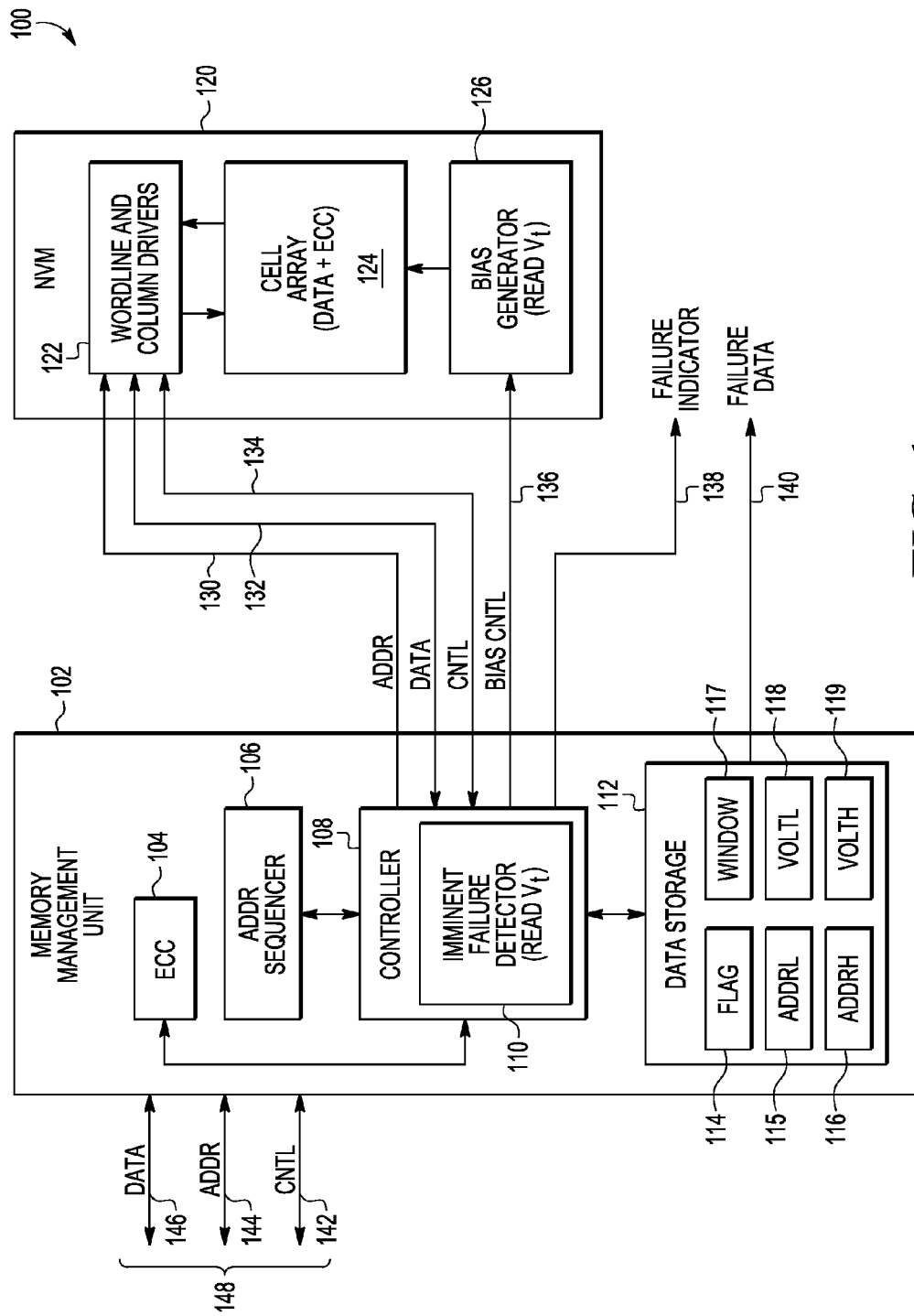
FIG. 1 is a block diagram for an NVM system that includes a memory management unit and a non-volatile memory (NVM).

FIG. 1 is a block diagram for an NVM system 100 that includes a memory management unit (MMU) 102 and a non-volatile memory (NVM) 120. The NVM 120 includes an array of NVM cells 124, wordline and column drivers 122, and bias generator 126. The memory management unit 102 includes error correction code (ECC) logic 104, address sequencer 106, controller 108, and data storage medium 112. The memory management unit 102 and the NVM 120 in part communicate address information through address (ADDR) signal lines 130, data through data (DATA) signal lines 132, and control information through control (CNTL) signal lines 134. The controller 108 further includes an imminent failure detector 110 that adjusts read margin levels (e.g., read threshold voltage (Vt) levels) to determine imminent failures based upon ECC results associated with diagnostic reads, as described in more detail below. Read voltage levels are adjusted for the cell array 124 through bias control (CNTL) signals 136 provided to the bias generator 126. For a read operation, an NVM cell will be deemed to be programmed (e.g., representing a first logic level) if it has a voltage level above the read voltage level, and an NVM cell will be deemed to be erased (e.g., representing a complement logic level) if it has a voltage level below the read voltage level.

Results and other data for the imminent failure determination can be stored as data within data storage medium 112. Failure related data can include, for example, a pass/fail flag 114, low margin read error addresses (ADDRL) 115, high margin read level addresses (ADDRH) 116, voltage window voltage threshold 117, low voltage sweep value (VOLTL) 118, high voltage sweep value (VOLTH) 119, and/or other data. A failure indicator 138 can be output by the memory management unit 102, and failure data 140 can be accessed by external circuitry or devices coupled to the memory management unit 102 and/or output by the NVM system 100 for use by external circuitry or devices. It is noted that the memory management unit 102 can be configured to communicate with external devices or circuitry through signal lines 148. For example, control information can be communicated through control (CNTL) signal lines 142; address information can be communicated through address (ADDR) signal lines 144; and data information can be communicated through data (DATA) signal lines 146. Additional and/or different interfaces can also be provided for the NVM system 100.

It is further noted that the memory control circuitry 102 and the NVM 120 can be integrated within a single integrated circuit or can be within separate integrated circuits, as desired. External devices or circuitry that communicate through signal lines 148 with the NVM system 100 can be additional circuitry that is located within the same integrated circuit(s) as the NVM system 100 or can be external to the integrated circuit(s) that include the NVM system 100. It is also noted that the NVM system 100 can include components and/or functional blocks in addition to the memory management unit 102 and the NVM 120, and the memory management unit 102 and/or the NVM 120 can also include additional functional blocks in addition to those depicted.

The NVM cell array 124 includes a plurality of NVM cells. In operation, the NVM cells are placed in programmed or erased states that represent logic values stored by the NVM cells. Error correction code (ECC) data associated with ECC routines implemented by the ECC logic 104 can be stored along with the data within the NVM cell array 124 or can be stored in another data storage medium such as data storage medium 112. For writes, the ECC logic 104 receives data to be stored in the NVM cell array 124 and generates the ECC data using one or more ECC routines. When the data is subsequently read from the NVM array 124 during a normal read operation or during a diagnostic read operation, the ECC data is also read. The ECC logic 104 then re-generates ECC check data based upon the data read from the NVM cell array 124. The ECC check data is then compared against the stored ECC data. If this comparison matches, then the data is deemed correct. If the comparison does not match, the data is deemed to include errors. In certain embodiments, the ECC routine(s) within the ECC logic 104 are configured to detect and correct single-bit errors and to detect but not correct double-bit errors.

The wordline driver and column drivers 122 provide access to the cell array 124. Wordline drivers apply wordline voltages to select rows of NVM cells within the NVM cell array 124. The rows of NVM cells are selected based upon the row address (ADDR) information 130 provided by the memory management unit 102. The column drivers access bit lines associated with the selected rows of NVM cells. Data to be written to and read from the cell array 124 is provided from the wordline and column drivers 122 to the memory management unit through data signals 132. The bias generator 126 generates bias signals that are applied to the cell array 124 during memory operations such as program, soft program, program verify, soft program verify, erase, erase verify, and/or read operations. The read voltage (Vt) level, which is adjusted in the embodiment described herein, is determined by the bias signals provided by the bias generator 126 to the NVM cell array 124. The data storage medium 112 can be any volatile or non-volatile programmable data storage medium that is configured to store data, such as a data register, a DRAM (dynamic random access memory), an additional NVM, and/or other data storage medium. The data storage medium 112 could also be located internal to or external from the memory management unit 102. For example, a portion of the NVM 120 could be used to provide the data storage medium 112. Other variations could also be implemented.

Read operations are used for memory diagnostics in addition to normal non-diagnostic read operations. For memory diagnostics, the controller 108 uses the address sequencer 106 to access each of the addresses within the cell array 124, reads data associated from each these addresses, and applies the ECC routine(s) to the read data to determine if data errors exist within the cell array. As described in more detail herein, the imminent error detector 110 is used during diagnostic modes to detect imminent read failures and identify addresses for which imminent failures have been detected. The failure indicator 138 indicates whether an imminent failure is detected, and the failure data 140 includes the address associated with the imminent failure and/or other desired information related to the imminent failure.

As described above, the ECC logic 104 applies one or more ECC routines to data being written to the NVM cell array 104 and generates ECC data that is stored and associated with data written to the NVM cell array 104. During a read operation, the ECC data is compared to re-generated ECC data to determine if data read from the NVM cell array includes bit errors. As further described below, the results of the ECC routine(s) applied by the ECC logic 104 are used by the imminent failure detector 110. It is further noted that the embodiments disclosed herein can use any desired ECC routine where single-bit errors are identified and corrected. It is further noted that the one or more ECC routines used for ECC logic 104 can be based upon Hamming codes, Reed-Solomon codes, BCH (Bose-Chaudhuri-Hocquenghem) codes, Viterbi decoders, and/or other error correction code techniques, as desired.

It is noted that the NVM systems described herein can be a variety of different NVM systems, including FLASH memory systems, systems using floating-gate NVM cells, systems using split-gate NVM cells, and/or other desired NVM systems. Further, charge storage layers within NVM cells can include discrete charge storage layers (e.g., silicon nanocrystals, metal nanoclusters, nitride, etc.), continuous charge storage layers (e.g., polysilicon, etc.), or other charge storage layers, if desired.

Figure 2:
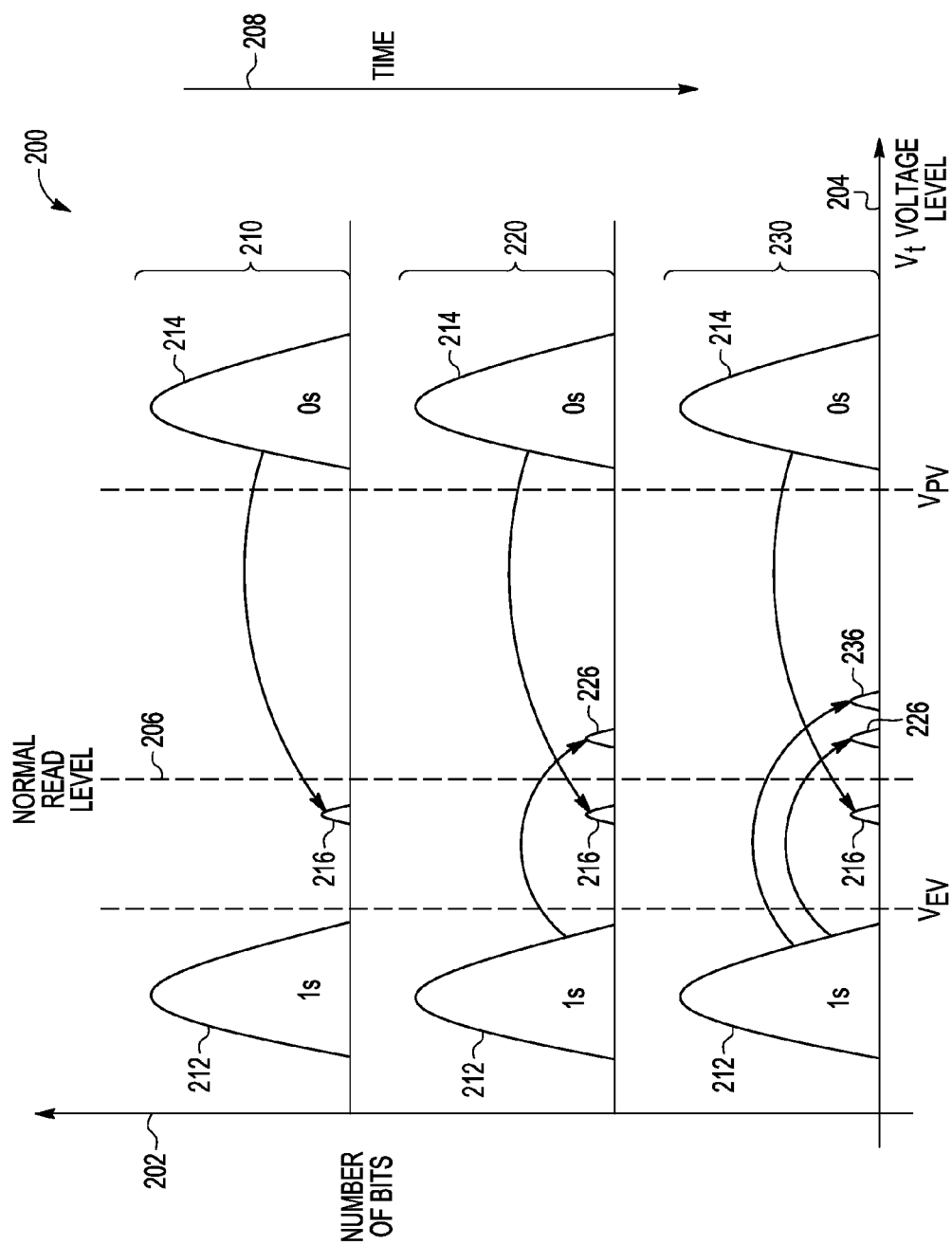
FIG. 2 is a bit distribution histogram showing representative changes that can occur in voltages stored in NVM cells associated with an address for the NVM array.

FIG. 2 is a bit distribution histogram 200 showing representative changes that can occur in voltages stored in NVM cells associated with an ECC checkbase address. For example, an ECC checkbase address can select N cells representing N bits of data for the address (e.g., 72 cells representing 72 bits of data including a 64-bit word plus 8 ECC parity bits). The y-axis 202 represents a number of bits within the N bits for the address having threshold voltage (Vt) levels in an erased state (e.g., representing logic 1s) and in a programmed state (e.g., representing logic 0s). The x-axis 204 represents threshold voltage (Vt) levels for the NVM cells. The distribution curve 212 represents the erased state bits, and the distribution curve 214 represents the programmed state bits. Voltage level 206 represents a normal read level such that bits having voltage levels above this read level are deemed to be programmed bits (e.g., logic 0s) and bits having voltage levels below this read level are deemed to be erased bits (e.g., logic 1s). It is also noted that the logic 0 or logic 1 designation give to an erased or programmed bit could be switched, if desired, such that an erased bit is a logic 0 and a programmed bit is a logic 1. It is also noted that the erased bits represent NVM cells that are in an erased state and that programmed bits represent NVM cells in a programmed state. Further, as one example, the normal read voltage level 206 can be 4.5 volts; the erase verify voltage level ($V_{EV}$) for distribution curve 212 can be 3.4 volts; and the program verify voltage level ($V_{PV}$) for distribution curve 214 can be 6.0 volts. Other variations could also be implemented.

Three distributions 210, 220, and 230 are provided over time 208 to show changes that can occur in the voltage distributions for the population of bits within the same ECC checkbase. These changes can in turn lead to non-recoverable errors and false ECC pass conditions. It is assumed that the bits for the address represented in embodiment 200 are originally in correct voltage states such that programmed bits have voltage levels above the normal read voltage level 206 and erased bits have voltage levels below the normal read voltage level 206.

Looking first to distribution 210, it is seen that one programmed bit 216 that should have a voltage level above the normal read voltage level 206 has an actual voltage level that is below the normal read level 206. A read operation therefore will return data for the address that will be off by one bit from the original correct bits for the address. As such, the ECC routine will identify a single-bit error and correct that error. Applications that are not sensitive to single-bit errors can continue to operate normally.

Next, looking to distribution 220, it is seen that an erased bit 226 that should have a voltage level below the normal read voltage level 206 has an actual voltage level that is above the normal read level 206. The bit 216 still has a voltage level that is incorrectly below the normal read level 206. A read operation therefore will return data for the address that will be off by two bits from the original correct bits for the address. As such, the ECC routine will identify a double-bit error and flag this as an uncorrectable error. Applications that are sensitive to double-bit errors can be placed in safe mode.

Looking now to distribution 230, it is seen that an additional erased bit 236 that should have a voltage level below the normal read voltage level 206 has an actual voltage level that is above the normal read level 206. The bit 216 still has a voltage level that is incorrectly below the normal read level 206, and the bit 226 still has a voltage level that is incorrectly above the normal read level 206. A read operation therefore will return data for the address that will be off by three bits from the original correct bits for the address. ECC routines often are not able to detect accurately three or more bit errors. For example, a three-bit error is often detected as a single-bit error because two of the bit errors may offset thereby being non-detectable. Similarly, four or more bit errors often are also not detectable by ECC routines. As such, applications that are sensitive to bit errors can have catastrophic failures as the ECC routine may incorrectly return a single-bit error and incorrectly apply a single-bit error correction or return a non-error condition when bit errors are actually present within the bits read from the address.

Figure 3:
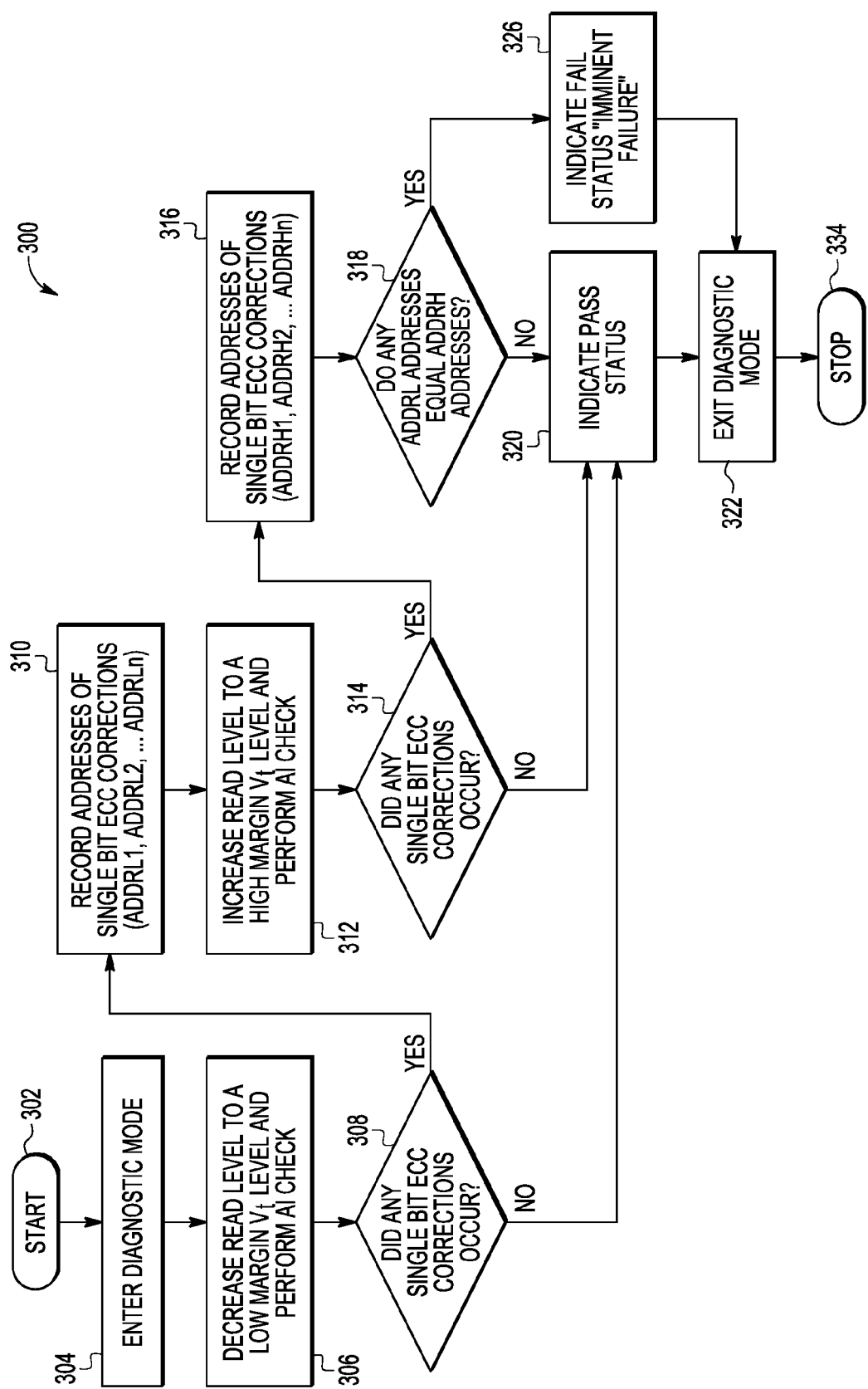
FIG. 3 is a process flow diagram of an example embodiment where high and low read voltage levels are used to identify addresses producing bit errors under both conditions to determine whether imminent read failure conditions exist.
Figure 4:
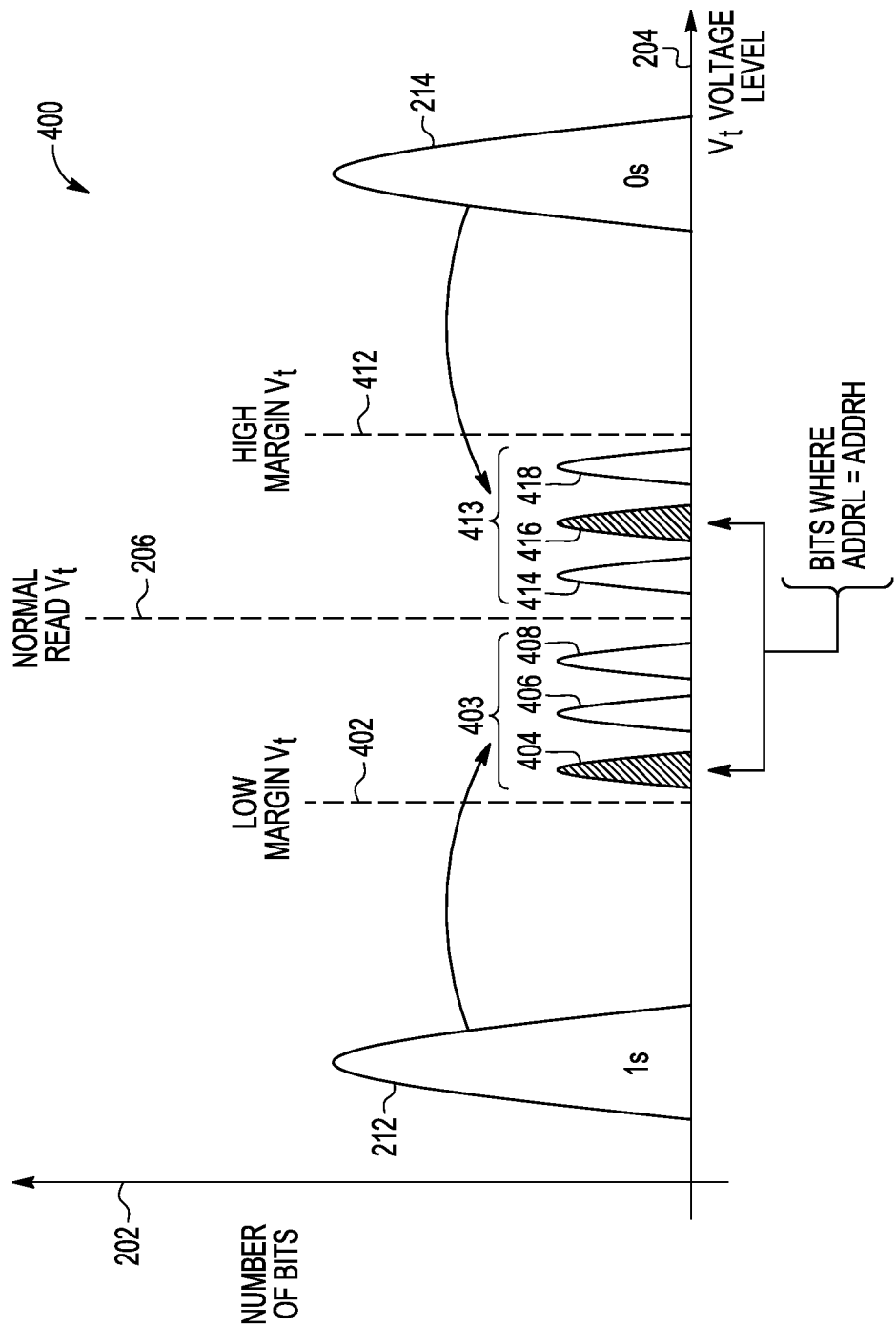
FIG. 4 is a bit distribution histogram associated with the embodiment of FIG. 3.
Figure 5:
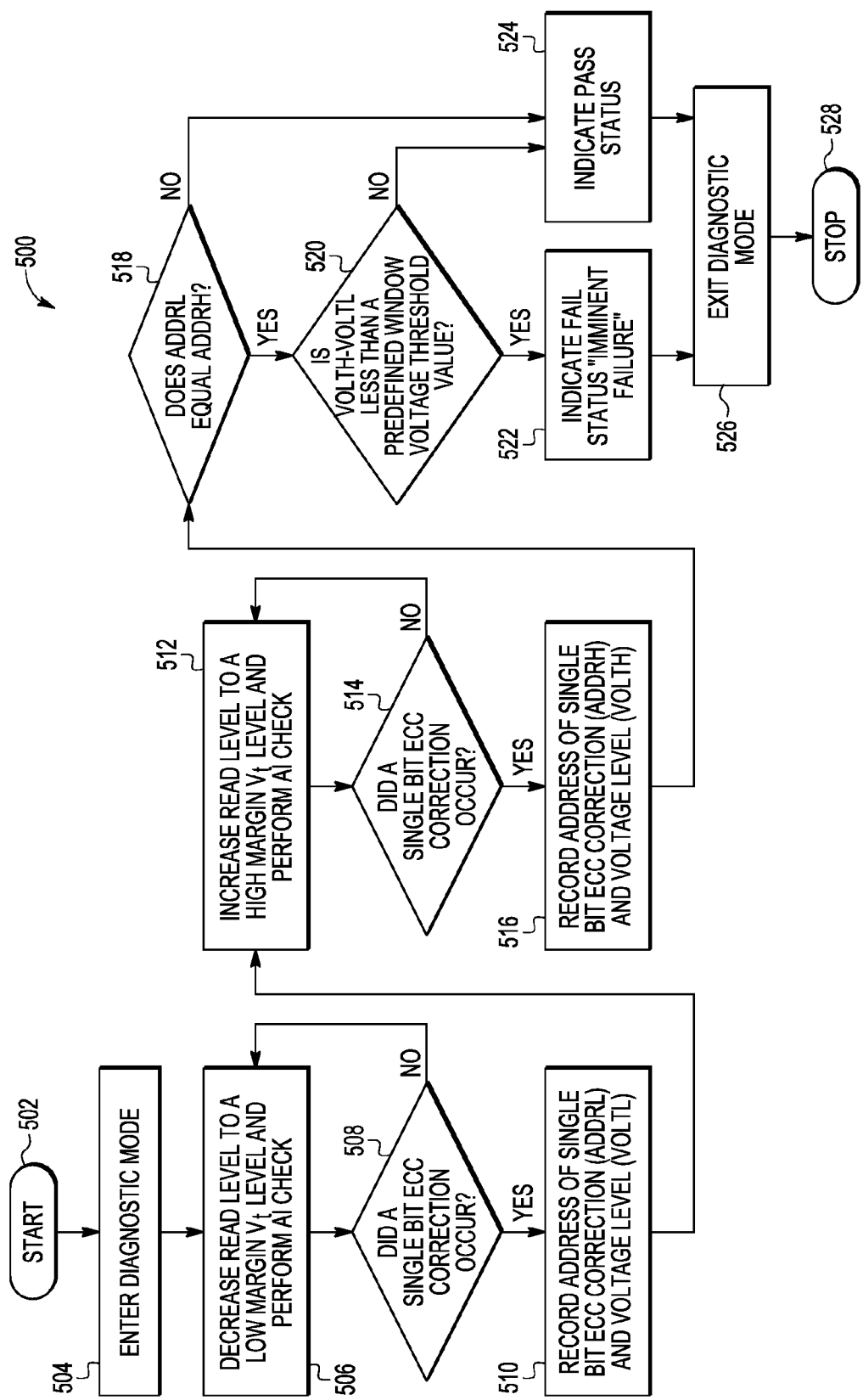
FIG. 5 is a process flow diagram of an example embodiment where high and low read voltage levels are swept away from a normal read voltage level to determine whether imminent read failure conditions exist
Figure 6:
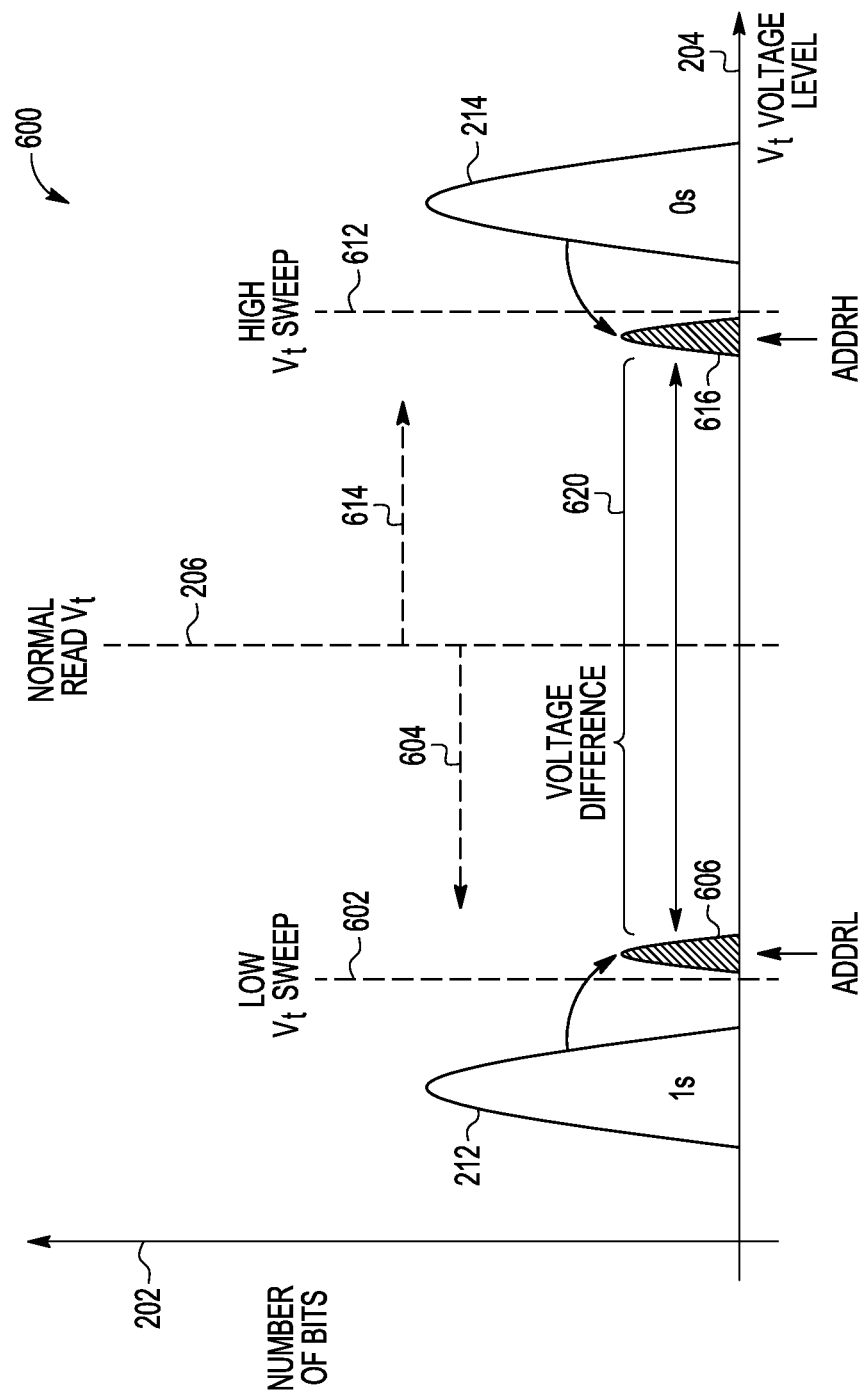
FIG. 6 is a bit distribution histogram associated with the embodiment of FIG. 5.

Advantageously, the embodiments described herein provide for detection of imminent read failures associated with bits within an ECC checkbase address that are moving from distributions above and below normal read levels to incorrect positions on the other side of the normal read level. FIG. 3 provides an example embodiment where high and low read level adjustments are used during a diagnostic mode to identify addresses producing bit errors under both conditions and to indicate imminent read failures for such addresses. FIG. 5 provides an example embodiment where high and low read voltage levels are incrementally swept to identify addresses producing bit errors and to indicate imminent read failures for such addresses where high/low error voltage levels differ by less than a predetermined voltage threshold window value. FIGS. 4 and 6 provide example distributions associated with the embodiments of FIGS. 3 and 5, respectively.

FIG. 3 is a process flow diagram of an example embodiment 300 where high and low read level adjustments are used to identify addresses producing bit errors under both conditions. The imminent failure detection process starts in block 302. In block 304, an error diagnostic mode is entered. In block 306, the read voltage level is adjusted to a selected voltage (Vt) level below the normal read voltage level that represents a low read margin voltage level. An array integrity (AI) check is then performed where the address sequencer 106 is used by the MMU 102 to cycle through addresses for the cell array 124 and to conduct a read and ECC operation for each address. In block 308, a determination is made whether the ECC logic 104 detected and corrected any single-bit errors. If "NO," then flow passes to block 320 where a pass status is indicated, for example, using the failure indicator signal 138 and/or flag 114. If "YES," then flow passes to block 310. In block 310, addresses are recorded for each address for which a single-bit error was detected and corrected by the ECC logic 104. These low margin error addresses (e.g., ADDRL1, ADDRL2, . . . ADDRLn), for example, can be stored within the data storage medium 112 as addresses (ADDRL) 115. Next, in block 312, the read voltage level is adjusted to a selected voltage (Vt) level above the normal read voltage level that represents a high read margin voltage level. An array integrity (AI) check is then performed where the address sequencer 106 is used by the MMU 102 to cycle through addresses for the cell array 124 and conduct a read and ECC operation for each address. In block 314, a determination is made whether the ECC logic 104 detected and corrected any single-bit errors. If "NO," then flow passes to block 320 where a pass status is indicated, for example, using the failure indicator signal 138. If "YES," then flow passes to block 316. In block 316, addresses are recorded for each address for which a single-bit error was detected and corrected by the ECC logic 104. These high margin error addresses (e.g., ADDRH1, ADDRH2, . . . ADDRHn), for example, can be stored within the data storage medium 112 as addresses (ADDRH) 119.

Once the low voltage read check and the high voltage read check have been conducted, the determination block 318 is then reached where a determination is made whether any of the low voltage error addresses (e.g., ADDRL1, ADDRL2, . . . ADDRLn) are equal to any of the high voltage error addresses (e.g., ADDRH1, ADDRH2, . . . ADDRHn). If "NO," then flow passes to block 320 where a pass status is indicated, for example, using the failure indicator signal 138 and/or flag 114. If "YES," then flow passes to block 326 wherein an imminent failure status is indicated as being detected, for example, using the failure indicator signal 138 and/or flag 114. The diagnostic mode is exited in block 322 which is reached from block 320 or block 326, and the process stops in block 324. It is noted that a failure flag 114 can also be stored within data storage medium 112 to represent the fail or pass status for the imminent failure detection. The failure data 140, including the flag 114 and the stored addresses 115/116, can be accessed by or output to external circuitry or devices. It is further noted that additional and/or different process blocks could also be used with respect to embodiment 300 if desired. For example, the diagnostic mode for embodiment 300 can be run only after a normal read ECC error is detected and corrected by the NVM system 100.

FIG. 4 is a bit distribution histogram 400 associated with the embodiment of FIG. 3. For embodiment 400, the y-axis 202 represents a number of bits within the cell array having threshold voltage (Vt) levels in an erased state (e.g., representing logic 1s) and in a programmed state (e.g., representing logic 0s). The x-axis 204 represents threshold voltage (Vt) levels for the NVM cells. The distribution curve 212 represents the erased state bits, and the distribution curve 214 represents the programmed state bits. Voltage level 206 represents a normal read voltage level such that bits having voltage levels above this read level are deemed to be programmed bits (e.g., logic 0s) and bits having voltage levels below this read level are deemed to be erased bits (e.g., logic 1s). Voltage level 402 represents a selected voltage level for the low margin read voltage (Vt) level, and voltage level 412 represents a selected voltage level for the high margin read voltage (Vt) level. It is again noted that the logic 0 or logic 1 designation give to an erased or programmed bit could be switched, if desired, such that an erased bit is a logic 0 and a programmed bit is a logic 1. It is further noted that the erased bits represent NVM cells that are in an erased state and that programmed bits represent NVM cells in a programmed state.

It is noted that example voltage values for one implementation can use a voltage level between 0.3 to 1.0 volts below the normal read voltage level for the low read margin voltage level and can use a voltage level between 0.3 to 1.5 volts above the normal voltage level for the high read margin voltage level. Further, for an additional example implementation, 4.5 volts can be used for the normal read voltage level; 4.0 volts can be used for the selected voltage level for the low margin read voltage level; and 5.0 volts can be used for the selected voltage level for the high margin read voltage level. Other voltages levels could be use as desired, and the voltage levels could also be adjusted over time.

As described above, the address sequencer 106 is used by the MMU 102 to cycle through the addresses for the cell array using the read voltage level 402 and also using the read voltage level 412. For embodiment 400, bits 403 represent three bits 404, 406, and 408 that are erased bits with voltage levels that have moved from distribution 212 towards the normal read level 206 but are not yet above the normal read level 206. When the low margin voltage level 402 is applied for a read test of the array cells, these bits 403 are each detected as imminent single-bit errors, and their associated address are recorded. Bits 413 represent three bits 414, 416, and 418 that are programmed bits with voltage levels that have moved from distribution 214 towards the normal read level 206 but are not yet below the normal read level 206. When the high margin voltage level 412 is applied for a read test of the array cells, these bits 413 are each detected as imminent single-bit errors, and their associated addresses are recorded. For the embodiment 400, the stored address (ADDRL) for bit 404 has matched the stored address (ADDRH) for bit 416, and this address is then recorded as an address associated with an imminent double-bit read failure.

TABLE 1 below provides example of detected bit errors and associated addresses.

TABLE 1

EXAMPLE BIT ERRORS AND ADDRESS MATCH

| Low Margin Read Test | | High Margin Read Test | |
|---|---|---|---|
| Bit 404 | ADDR-A | Bit 414 | ADDR-D |
| Bit 406 | ADDR-B | Bit 416 | ADDR-A |
| Bit 408 | ADDR-C | Bit 418 | ADDR-E |

As seen in TABLE 1, the address (ADDR-A) recorded for error bit 404 is equal to the address (ADDR-A) recorded for bit 416, while the other addresses (ADDR-B, ADDR-C, ADDR-D, ADDR-E) do not match. As such, an imminent read failure error is detected and reported, for example, using the failure indicator 138 and/or the flag 114, and the ADDR-A represents a faulty address that should not be used due to an imminent uncorrectable read failure. For example, if another bit in the ADDR-A address were to cross either the low or high margin voltage levels, a three-bit error would potentially occur that would not be correctly detected by the ECC routine thereby resulting in an undetectable error.

FIG. 5 is a process flow diagram of an example embodiment 500 where high and low read level adjustments are swept to identify a voltage window for high and low bit errors. The imminent failure detection process starts in block 502. In block 504, an error diagnostic mode is entered. In block 506, the read voltage level is incrementally decreased to a voltage (Vt) level below the normal read voltage level. An array integrity (AI) check is then performed where the address sequencer 106 is used by the MMU 102 to cycle through addresses for the cell array 124 and to conduct a read and ECC operation for each address. In block 508, a determination is made whether the ECC logic 104 detected and corrected any single-bit errors. If "NO," then flow passes back to block 506 where the read voltage level is again incrementally decreased to another voltage (Vt) level further below the normal read voltage level. Steps 506 and 508 are repeated until a single-bit ECC error is detected and the determination in block 508 is "YES." It is noted that the incremental decreases to the read voltage level can be, for example, in increments of 0.1 volts and other incremental values can also be utilized, as desired. Once the determination in block 508 is "YES," block 510 is reached where the address (ADDRL) for the single-bit ECC correction and the associated low voltage level (VOLTL) at which the single-bit ECC error correction was detected are stored. For example, the address can be stored as a low error address (ADDRL) 115 in data storage medium 112, and the low voltage level (VOLTL) can be stored as low voltage level 118 in data storage medium 112.

In block 512, the read voltage level is incrementally increased to a voltage (Vt) level above the normal read voltage level. An array integrity (AI) check is then performed where the address sequencer 106 is used by the MMU 102 to cycle through addresses for the cell array 124 and to conduct a read and ECC operation for each address. In block 514, a determination is made whether the ECC logic 104 detected and corrected any single-bit errors. If "NO," then flow passes back to block 512 where the read voltage level is again incrementally increased to a different voltage (Vt) level further above the normal read voltage level. Steps 512 and 514 are repeated until a single-bit ECC error is detected and the determination in block 514 is "YES." It is noted that the incremental increases to the read voltage level can be, for example, in increments of 0.1 volts and other incremental values can also be utilized, as desired. Once the determination in block 514 is "YES," block 516 is reached where the address (ADDRH) for the single-bit ECC correction and the associated high voltage level (VOLTH) at which the single-bit ECC error correction was detected are stored. For example, the address can be stored as a high error address (ADDRH) 115 in data storage medium 112, and the high voltage level (VOLTH) can be stored as high voltage level 119 in data storage medium 112.

Block 518 is then reached where a determination is made whether the low voltage address (ADDRL) recorded for the low voltage sweep diagnostic test matches the high voltage address (ADDRH) recorded for the high voltage sweep diagnostic test. If "NO," then flow passes to block 524 where a pass status is indicated, for example, using the failure indicator signal 138 and/or flag 114. If "YES," then block 520 is reached where a determination is made whether the difference between the high voltage level (VOLTH) and the low voltage level is less than a predefined window voltage threshold value (e.g., VOLTH−VOLTL<WINDOW). If "NO," flow passes to block 524 where a pass status is indicated, for example, using the failure indicator signal 138 and/or flag 114. If the determination in block 520 is "YES," then flow passes to block 522 wherein an imminent fail status is indicated, for example, using the failure indicator signal 138 and/or flag 114. The diagnostic mode is exited in block 526 which is reached from block 522 or block 524, and the process stops in block 528. It is noted that a failure flag 114 can also be stored within data storage medium 112 to represent the fail or pass status for the imminent failure detection. The failure data 140, including the flag 114, the stored addresses 115/116, the voltage window threshold value 117, and the stored voltage levels 118/119 can be accessed by or provided to external circuitry or devices. It is further noted that additional and/or different process blocks could also be used with respect to embodiment 500 if desired. For example, the diagnostic mode for embodiment 500 can be run only after a normal read ECC error is detected and corrected by the NVM system 100.

It is further noted that the predefined window voltage threshold value can be a predetermined voltage value that is selected to represent an acceptable difference between the low read voltage error value and the high read voltage error trigger value. If the detected difference (VOLTH−VOLTL) is equal to or above this predetermined voltage value, then it can be assumed that a read failure is not imminent. However, if the detected difference (VOLTH−VOLTL) is below this predetermined voltage value, then it can be assumed that a read failure is imminent. This voltage window threshold value 117 can be selected based upon characterizations, testing, empirical data, and/or other information associated with the NVM system. Further, this voltage window threshold value 117 can be adjusted over time, if desired, and this voltage window threshold value 117 can be stored within data storage medium 112.

FIG. 6 is a bit distribution histogram 600 associated with the embodiment of FIG. 5. For embodiment 600, the y-axis 202 represents a number of bits within the cell array having threshold voltage (Vt) levels in an erased state (e.g., representing logic 1s) and in a programmed state (e.g., representing logic 0s). The x-axis 204 represents threshold voltage (Vt) levels for the NVM cells. The distribution curve 212 represents the erased state bits, and the distribution curve 214 represents the programmed state bits. Voltage level 206 represents a normal read level such that bits having voltage levels above this read level are deemed to be programmed bits (e.g., logic 0s) and bits having voltage levels below this read level are deemed to be erased bits (e.g., logic 1s). Voltage level 602 represents a voltage level for the low margin read voltage (Vt) level that is incrementally decreased to lower values as indicated by arrow 604, and voltage level 612 represents a voltage level for the high margin read voltage (Vt) level that is incrementally increased to higher values as indicated by arrow 614. It is again noted that the logic 0 or logic 1 designation give to an erased or programmed bit could be switched, if desired, such that an erased bit is a logic 0 and a programmed bit is a logic 1. Other variations could also be implemented.

It is also noted that for one example implementation voltages can be incrementally decreased from the normal read voltage level using voltage steps of between 0.05 to 0.10 volt steps for the low voltage sweep 604 and can be incrementally increased from the normal read voltage level by 0.05 to 0.10 volt steps for high voltage sweep 614. Further, for an additional example implementation, 4.5 volts can be used for the normal read voltage level, and 0.1 volts can be used for the voltage increments. Other voltages levels and voltage increments could be use as desired, and the voltage levels and voltage increments could also be adjusted over time.

As described above, the address sequencer 106 is used by the MMU 102 to cycle through the addresses for the cell array for each voltage level 602 during the low voltage sweep 604 and for each voltage level 612 during the high voltage sweep 614. For embodiment 600, bit 606 represents the erased bit that first causes a single-bit ECC error during the low voltage sweep 604. As indicated above, the voltage level (VOLTL) and the address (ADDRL) are recorded when the single-bit error is detected for bit 606. Bit 616 represents the programmed bit that first causes a single-bit ECC error during the high voltage sweep 614. As indicated above, the voltage level (VOLTH) and the address (ADDRH) are recorded when the single-bit error is detected for bit 616. As indicated above, if the addresses are equal (e.g., ADDRL=ADDRH) and the voltage difference 620 between the high voltage level (VOLTH) and the low voltage level (VOLTL) is less than predetermine voltage window threshold value (WINDOW), then an imminent read failure is indicated. Otherwise, an imminent read failure is not indicated.

TABLE 2 below provides example of detected bit errors and associated addresses for three low/high sweep tests.

TABLE 2

EXAMPLE BIT ERRORS AND ADDRESS MATCH

| Low/High Sweep Tests | Low Error Address | High Error Address | Voltage Difference (VOLTH − VOLTL) | Imminent Failure |
|---|---|---|---|---|
| 1 | ADDR-A | ADDR-B | NA | NO |
| 2 | ADDR-A | ADDR-A | ≥WINDOW | NO |
| 3 | ADDR-A | ADDR-A | <WINDOW | YES |

As seen in TABLE 2, the low error address (ADDR-A) recorded for the first low sweep test is not equal to the high address (ADDR-B) recorded for the first high sweep test. As such, the voltage difference can be ignored as not applicable (NA), and a pass condition is indicated and reported, for example, using the failure indicator 138 and/or the flag 114. The low error address (ADDR-A) recorded for the second low sweep test is equal to the high address (ADDR-A) recorded for the second high sweep test. As such, the voltage difference is checked. As the voltage difference is greater than or equal to the voltage window threshold value (WINDOW), a pass condition is indicated and reported, for example, using the failure indicator 138 and/or the flag 114. For the third low/high sweep test, the low error address (ADDR-A) recorded for the second low sweep test is also equal to the high address (ADDR-A) recorded for the second high sweep test. As such, the voltage difference is again checked. However, as the voltage difference is less than the voltage window threshold value (WINDOW), an imminent read failure condition is indicated and reported, for example, using the failure indicator 138 and/or the flag 114, and the ADDR-A represents an faulty address that should not be used due to imminent read failures that may be undetectable.

As described herein, a variety of embodiments can be implemented and different features and variations can be implemented, as desired.

In one embodiment, a method for detecting imminent read failures for a non-volatile memory (NVM) system is disclosed that includes using a normal read voltage level for read operations for an array of non-volatile memory (NVM) cells, adjusting a read voltage level to one or more low voltage levels below the normal read voltage level, and adjusting a read voltage level to one or more high voltage levels above the normal read voltage level. For each of the one or more low voltage levels, the method further includes performing one or more first read and error correction operations for a plurality of addresses associated with the array of NVM cells and recording one or more first addresses for bit errors detected with respect to the one or more first read and error correction operations. For each of the one or more high voltage levels, the method further includes performing one or more second read and error correction operations for a plurality of addresses associated with the array of NVM cells and recording one or more second addresses for bit errors detected with respect to the one or more second read and error correction operations. The method further includes comparing the one or more first addresses and the one or more second addresses to determine one or more address matches and indicating an imminent read failure for the array of NVM cells at least in part based upon the comparison.

For other embodiments, a predetermined low voltage level and a predetermined high voltage level are used for the adjusting steps. Further, the predetermined low voltage level can be between 0.3 to 1.0 volts below the normal read voltage level, and the predetermined high voltage level can be between 0.3 to 1.5 volts above the normal voltage level.

For further embodiments for the adjusting steps, the read voltage level is incrementally decreased to read voltage levels below the normal read voltage level until a low bit error is detected, and the read voltage level is incrementally increased to read voltage levels above a normal read voltage level until a high bit error is detected. In addition, the recording steps can include recording a low error address and a low error voltage level for the low bit error and a high error address a high error voltage level for the high bit error. Further, the comparing step can include comparing the first error address to the second error address and if they match, further comparing a difference between the low error voltage level and the high error voltage level to a voltage threshold value. Still further for the adjusting steps, the read voltage levels can be incrementally decreased and increased from the normal read voltage level by between 0.05 to 0.10 volt steps.

For additional embodiments, the method can also include using error correction code (ECC) logic to run one or more ECC routines for the error correction operations where the one or more ECC routines being configured to detect single-bit errors. In addition, the indicating step can include storing within a data storage medium matching addresses and a flag indicating that an imminent read failure condition has been detected. Further, the method can include allowing read access to the matching addresses and the flag within the data storage medium. In other embodiments, the indicating step can include outputting a failure indicator signal.

For still further embodiments, the adjusting, comparing, and indicating steps can be performed within a diagnostic mode for the NVM system. In addition, the method can include entering the diagnostic mode only after a read error is detected and corrected by the NVM system during a normal read operation.

In another embodiment, a non-volatile memory (NVM) system having imminent read failure detection is disclosed that includes a non-volatile memory (NVM) including an array of NVM cells, a memory management unit coupled to the array of NVM cells, and a controller within the memory management unit coupled to the NVM and configured to perform read operations for the NVM cells using a normal read voltage level. The controller is configured to adjust a read voltage level to one or more low voltage levels below a normal read voltage level and for each of the one or more low voltage levels to perform one or more first read and error correction operations for a plurality of addresses associated with the array of NVM cells and to record one or more first addresses for bit errors detected with respect to the one or more first read and error correction operations. The controller is also configured to adjust a read voltage level to one or more high voltage levels above the normal read voltage level and for each of the one or more high voltages levels to perform one or more second read and error correction operations for a plurality of addresses associated with the array of NVM cells and to record one or more second addresses for bit errors detected with respect to the one or more second read and error correction operations. The controller is further configured to compare the one or more first addresses and the one or more second addresses to determine one or more address matches and to indicate an imminent read failure for the array of NVM cells at least in part based upon the comparison.

For other embodiments, a predetermined low voltage level and a predetermined high voltage level are used for the adjustments.

For further embodiments for the adjustments, the controller is further configured to incrementally decrease the read voltage level to read voltage levels below the normal read voltage level until a low bit error is detected and to incrementally increase the read voltage level to read voltage levels above a normal read voltage level until a high bit error is detected. In addition, the controller can be further configured to record a low error address and a low error voltage level for the low bit error and to record a high error address a high error voltage level for the high bit error. Further, the controller can be configured to compare the low error address to the high error address and if they match, further compare a difference between the low error voltage level and the high error voltage level to a voltage threshold value.

For additional embodiments, the memory management unit can further include error correction code (ECC) logic configured to run one or more ECC routines, and the controller can be further configured to use the ECC logic for the error correction operations.

For still further embodiments, the NVM system can further include a data storage medium configured to store the one or more first addresses, the one or more second addresses, and a flag indicating that an imminent read failure condition has been detected.

It is noted that the functional blocks, devices, and/or circuitry described herein, including those described with respect to the memory management unit 102 and the non-volatile memory 120, can be implemented using hardware, software, or a combination of hardware and software. In addition, one or more processing devices executing software and/or firmware instructions can be used to implement the disclosed embodiments. It is further understood that one or more of the operations, tasks, functions, or methodologies described herein can be implemented, for example, as software, firmware and/or other program instructions that are embodied in one or more non-transitory tangible computer readable mediums (e.g., data storage devices, FLASH memory, random access memory, read only memory, programmable memory devices, reprogrammable storage devices, hard drives, floppy disks, DVDs, CD-ROMs, and/or any other tangible storage medium) and that are executed by one or more central processing units (CPUs), controllers, microcontrollers, microprocessors, hardware accelerators, processors, and/or other processing devices to perform the operations and functions described herein.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A method for detecting imminent read failures for a non-volatile memory (NVM) system, comprising:
    using a normal read voltage level for read operations for an array of non-volatile memory (NVM) cells;
    adjusting a read voltage level to one or more low voltage levels below the normal read voltage level and for each of the one or more low voltage levels:
        performing one or more first read and error correction operations for a plurality of addresses associated with the array of NVM cells; and
        recording one or more first addresses for bit errors detected with respect to the one or more first read and error correction operations;
    adjusting a read voltage level to one or more high voltage levels above the normal read voltage level and for each of the one or more high voltage levels:
        performing one or more second read and error correction operations for a plurality of addresses associated with the array of NVM cells; and
        recording one or more second addresses for bit errors detected with respect to the one or more second read and error correction operations;
    comparing the one or more first addresses and the one or more second addresses to determine one or more address matches; and
    indicating an imminent read failure for the array of NVM cells at least in part based upon the comparison.

2. The method of claim 1, wherein a predetermined low voltage level and a predetermined high voltage level are used for the adjusting steps.

3. The method of claim 2, wherein the predetermined low voltage level is between 0.3 to 1.0 volts below the normal read voltage level, and wherein the predetermined high voltage level is between 0.3 to 1.5 volts above the normal voltage level.

4. The method of claim 1, wherein for the adjusting steps the read voltage level is incrementally decreased to read voltage levels below the normal read voltage level until a low bit error is detected and the read voltage level is incrementally increased to read voltage levels above a normal read voltage level until a high bit error is detected.

5. The method of claim 4, wherein the recording steps comprise recording a low error address and a low error voltage level for the low bit error and a high error address a high error voltage level for the high bit error.

6. The method of claim 5, wherein the comparing step comprises comparing the first error address to the second error address and if they match, further comparing a difference between the low error voltage level and the high error voltage level to a voltage threshold value.

7. The method of claim 6, wherein for the adjusting steps the read voltage levels are incrementally decreased and increased from the normal read voltage level by between 0.05 to 0.10 volt steps.

8. The method of claim 1, further comprising using error correction code (ECC) logic to run one or more ECC routines for the error correction operations, the one or more ECC routines being configured to detect single-bit errors.

9. The method of claim 1, wherein the indicating step comprises storing within a data storage medium matching addresses and a flag indicating that an imminent read failure condition has been detected.

10. The method of claim 9, further comprising allowing read access to the matching addresses and the flag within the data storage medium.

11. The method of claim 1, wherein the indicating step comprises outputting a failure indicator signal.

12. The method of claim 1, wherein the adjusting, comparing, and indicating steps are performed within a diagnostic mode for the NVM system.

13. The method of claim 1, further entering the diagnostic mode only after a read error is detected and corrected by the NVM system during a normal read operation.

14. A non-volatile memory (NVM) system having imminent read failure detection, comprising:
    a non-volatile memory (NVM) including an array of NVM cells;
    a memory management unit coupled to the array of NVM cells;
    a controller within the memory management unit coupled to the NVM and configured to perform read operations for the NVM cells using a normal read voltage level;
    the controller being configured to adjust a read voltage level to one or more low voltage levels below a normal read voltage level and for each of the one or more low voltage levels:
        to perform one or more first read and error correction operations for a plurality of addresses associated with the array of NVM cells, and
        to record one or more first addresses for bit errors detected with respect to the one or more first read and error correction operations;
    the controller being configured to adjust a read voltage level to one or more high voltage levels above the normal read voltage level and for each of the one or more high voltages levels:
        to perform one or more second read and error correction operations for a plurality of addresses associated with the array of NVM cells, and
        to record one or more second addresses for bit errors detected with respect to the one or more second read and error correction operations; and the controller being configured to compare the one or more first addresses and the one or more second addresses to determine one or more address matches and to indicate an imminent read failure for the array of NVM cells at least in part based upon the comparison.

15. The NVM system of claim 14, wherein a predetermined low voltage level and a predetermined high voltage level are used for the adjustments.

16. The NVM system of claim 14, wherein for the adjustments the controller is further configured to incrementally decrease the read voltage level to read voltage levels below the normal read voltage level until a low bit error is detected and to incrementally increase the read voltage level to read voltage levels above a normal read voltage level until a high bit error is detected.

17. The NVM system of claim 16, wherein the controller is further configured to record a low error address and a low error voltage level for the low bit error and a high error address a high error voltage level for the high bit error.

18. The NVM system of claim 17, wherein the controller is further configured to compare the low error address to the high error address and if they match, further compare a difference between the low error voltage level and the high error voltage level to a voltage threshold value.

19. The NVM system of claim 14, wherein the memory management unit further comprises error correction code (ECC) logic configured to run one or more ECC routines, and wherein the controller is further configured to use the ECC logic for the error correction operations.

20. The NVM system of claim 14, further comprising a data storage medium configured to store the one or more first addresses, the one or more second addresses, and a flag indicating that an imminent read failure condition has been detected.

* * * * *